United States Patent
Freudenberg et al.

(12) 
(10) Patent No.: US 6,366,868 B2
(45) Date of Patent: Apr. 2, 2002

(54) METHOD AND CONFIGURATION FOR DIAGNOSIS OF A CAPACITIVE ACTUATOR

(75) Inventors: Hellmut Freudenberg, Grossberg; Hartmut Gerken, Nittendorf; Martin Hecker, Laimerstadt; Christian Hoffmann, Regensburg; Richard Pirkl, Regensburg; Walter Schrod, Regensburg, all of (DE)

(73) Assignee: Siemens Aktiengesellschaft AG, Munich (DE)

( * ) Notice: Subject to any disclaimer, the term of this patent is extended or adjusted under 35 U.S.C. 154(b) by 0 days.

(21) Appl. No.: 09/821,968

(22) Filed: Mar. 30, 2001

Related U.S. Application Data

(63) Continuation of application No. PCT/DE99/03120, filed on Sep. 28, 1999.

(30) Foreign Application Priority Data

Sep. 30, 1998 (DE) .......................................... 198 45 042

(51) Int. Cl.$^7$ ........................... H01L 41/04; H01H 19/64
(52) U.S. Cl. .................. 702/115; 310/316.03; 307/113; 307/125
(58) Field of Search .................... 702/115; 310/316.03, 310/317; 320/116; 307/113, 125

(56) References Cited

U.S. PATENT DOCUMENTS

| | | | | | |
|---|---|---|---|---|---|
| 4,297,734 | A | * | 10/1981 | Laishely et al. | 360/78 |
| 6,198,199 | B1 | * | 3/2001 | Hoffmann et al. | 310/316.03 |
| 6,236,190 | B1 | * | 5/2001 | Hoffmann et al. | 320/166 |
| 6,271,618 | B1 | * | 8/2001 | Hoffmann et al. | 310/316.03 |

* cited by examiner

*Primary Examiner*—Kamini Shah
(74) *Attorney, Agent, or Firm*—Herbert L. Lerner; Laurence A. Greenberg; Werner H. Stemer

(57) ABSTRACT

A method of diagnosing an actuator includes supplying a predeterminable amount of energy to an actuator through a charge-reversal circuit. Faulty functional statuses of the actuator and its supply lines and/or its drive circuits, short- or long-term interruptions, short-circuits within the actuator or its supply lines, or excessively low capacitance values may be deduced from a discrepancy between reference values and determined variables including actuator voltage, actuator current, and actuator charge. A short-circuit of an electrical connection within the actuator or an electrical connection between the drive circuit and the actuator can be deduced if the actuator voltage is less than a lower voltage value. An interruption in the electrical connection within is the actuator or an electrical connection between the drive circuit and the actuator may be deduced if an actuator peak current is less than a lower current value. An apparatus for performing the method is also provided.

25 Claims, 6 Drawing Sheets

METHOD AND CONFIGURATION FOR DIAGNOSIS OF A CAPACITIVE ACTUATOR

CROSS-REFERENCE TO RELATED APPLICATION

This application is a continuation of copending International Application No. PCT/DE99/03120, filed Sep. 28, 1999 which designated the United States.

BACKGROUND OF THE INVENTION

1. Field of the Invention

The invention relates to a method for diagnosis of a capacitive actuator and an associated drive circuit, in particular, a piezoelectric actuator for a fuel injection valve, and a configuration for carrying out the method.

A method for driving an actuator is described in German Published, Non-Prosecuted Patent Application DE 196 44 521 A1. According to the method therein, a capacitive actuator is supplied with a predeterminable amount of energy by charge reversal of a charge-storage capacitor, which is charged to an initial voltage value, through a ringing coil to the actuator until the charge-storage capacitor has reached a predeterminable final voltage value. The amount of energy transmitted to the actuator is determined from the voltage difference between the initial voltage value and the final voltage value. Alternatively, the actuator current supplied to the actuator and the actuator voltage applied to the actuator are multiplied, the product is integrated, and the integral value is compared with a predeterminable nominal value. The charge-reversal process is interrupted when the integral value reaches or exceeds the nominal value.

2. Summary of the Invention

It is accordingly an object of the invention to provide a method and configuration for diagnosis of a capacitive actuator and of an associated drive circuit that overcomes the hereinafore-mentioned disadvantages of the heretofore-known methods and devices of this general type.

With the foregoing and other objects in view, there is provided, in accordance with the invention, a method of diagnosing a capacitive actuator and an associated drive circuit, including the steps of transmitting a predeterminable amount of energy to an actuator from a charge-storage capacitor through a ringing coil, deducing a functional status of at least one of the actuator and an associated drive circuit from a discrepancy between reference values and at least one determined variable including actuator voltage, actuator current, and actuator charge, deducing a short-circuit of at least one of an electrical connection within the actuator and an electrical connection between the drive circuit and the actuator if the actuator voltage is less than a lower voltage value of the reference values, and deducing an interruption in at least one of the electrical connection within the actuator and the electrical connection between the drive circuit and the actuator if an actuator peak current is less than a lower current value of the reference values.

The invention is based on the idea that a drive circuit with a charge-storage capacitor and a ringing coil, which form a series tuned circuit together with the actuator, reacts in a predictable manner when faults that are typical of the actuator occur. For example, an actuator voltage measured across the actuator, an actuator current flowing through the actuator, or an actuator charge applied to the actuator can be used, by comparison with predetermined reference values, to deduce the functional status of the actuator and of the associated drive circuit.

In accordance with another mode of the invention, a serviceable functional status is deduced if the actuator voltage is between the lower voltage value and an upper voltage value of the reference values.

In accordance with a further mode of the invention, an excessively low actuator capacitance is deduced if the actuator voltage is greater than an upper voltage value of the reference values.

In accordance with an added mode of the invention, an interruption in at least one of the electrical connection within the actuator and the electrical connection between the drive circuit and the actuator is deduced if the actuator voltage is greater than a upper voltage value of the reference values.

In accordance with an additional mode of the invention, the actuator voltage is measured during a hold time.

In accordance with yet another mode of the invention, the actuator voltage is measure during a rise time, and a short-term interruption in the electrical connection within the actuator during a deflection process of the actuator is deduced if the actuator voltage is greater than an upper peak voltage of the reference values.

In accordance with yet a further mode of the invention, the actuator peak current is determined during a rise time as the maximum value of the actuator current.

In accordance with yet an added mode of the invention, a correct functional status is deduced if the actuator peak current is between a further lower current value of the reference values and an upper current value of the reference values.

In accordance with yet an additional mode of the invention, an excessively low actuator capacitance is deduced if the actuator peak current is less than a further lower current value of the reference values.

In accordance with again another mode of the invention, a short-circuit in at least one of the electrical connection within the actuator and the electrical connection between the drive circuit and the actuator is deduced if the actuator peak current is greater than an upper current value of the reference values.

In accordance with again a further mode of the invention, the actuator charge is determined from a charge-storage capacitor to the actuator during a rise time.

In accordance with again an added mode of the invention, a correct functional status is deduced if the actuator charge is between a lower charge value of the reference values and an upper charge value of the reference values.

In accordance with again an additional mode of the invention, an excessively low actuator capacitance is deduced if the actuator charge is less than a lower charge value of the reference values.

In accordance with still another mode of the invention, an interruption in at least one of the electrical connection within the actuator and the electrical connection between the drive circuit and the actuator is deduced if the actuator charge is less than a lower charge value of the reference values.

In accordance with still a further mode of the invention, a short-circuit of at least one of the electrical connection within the actuator and the electrical connection between the drive circuit and the actuator is deduced if the actuator charge is greater than an upper charge value of the reference values.

In accordance with still an added mode of the invention, the reference values are dependent on a temperature of the actuator.

In accordance with still an additional mode of the invention, a reaction to a fault is initiated after an occurrence of more than a predetermined number of faults of a given fault type within a predetermined fault time.

In accordance with another mode of the invention, a discrepancy between a value of the at least one determined variable of the actuator in a drive process from another value of the at least one determined variable of the actuator is determined in a subsequent drive process, and deducing a fault if the discrepancy exceeds a predetermined tolerance band.

With the objects of the invention in view, there is also provided a configuration for diagnosing a capacitive actuator and a drive circuit, including a drive circuit having a drive signal for controlling a drive process of the actuators, a charge-reversal circuit having, at least one charge-storage capacitor, at least one ringing coil, charge-reversal switches, diodes, and selection switches, and an energy source connected to the charge-reversal circuit, actuators having electrical connections, the actuators connected to the charge-reversal circuit, the actuators having actuator voltages, actuator currents, and actuator temperatures, the at least one charge-storage capacitor transmitting a predeterminable amount of energy to at least one of the actuators through the at least one ringing coil, a microprocessor-controlled controller connected to the drive circuit and to the actuators, the controller programmed to process the drive signal, the actuator voltages, the actuator currents, and the actuator temperatures, the controller having, a constant memory storing reference values including a lower voltage value and a lower current value, a logic unit producing control signals driving the charge-reversal switches and selection signals driving the selection switches for selection of the actuators, and comparators comparing at least one of the actuator voltages and the actuator currents with the reference values and producing comparison signals for the logic unit, the controller outputting a function signal representing a functional status based upon the comparison signals, and the controller programmed to deduce, a short-circuit of at least one of an electrical connection within one of the actuators and an electrical connection between the drive circuit and at least one of the actuators if one of the actuator voltages is less than the lower voltage value, and an interruption in at least one of an electrical connection within one of the actuators and an electrical connection between the drive circuit and at least one of the actuators if an actuator peak current is less than the lower current value.

In accordance with another feature of the invention, the controller has an analog/digital converter for receiving the actuator voltages and for outputting digitized values of the actuator voltages to the logic unit.

In accordance with a further feature of the invention, there is provided a peak value detector to determine a peak voltage of at least one of the actuators based upon at least one of the actuator voltages, the reference values including a predetermined upper peak voltage, and the controller having a peak value comparator comparing the peak voltage with the predetermined upper peak voltage and outputting a comparison result to the logic unit.

In accordance with an added feature of the invention, the reference values include lower voltage values and upper voltage values, and the controller has a voltage comparator comparing at least one of the actuator voltages with at least one of the lower voltage values and the upper voltage values and outputting a comparison result to the logic unit.

In accordance with an additional feature of the invention, there is provided a maximum-value forming device determining the actuator peak current from the actuator currents, the reference values including lower voltage values, upper voltage values, and an upper current value, the controller having a current comparator comparing the actuator peak current with the lower current value and the upper current value, and the controller programmed to output a comparison result to the logic unit.

In accordance with a concomitant feature of the invention, there is provided an integrator integrating at least one of the actuator currents over time to determine an actuator charge, the reference values including a lower charge value and an upper charge value, the controller having a charge comparator comparing the charge transmitted to at least one of the actuators with at least one of the lower charge value and the upper charge value, and the controller is programmed to output a comparison result to the logic unit Other features that are considered as characteristic for the invention are set forth in the appended claims.

Although the invention is illustrated and described herein as embodied in a method and configuration for diagnosis of a capacitive actuator and of an associated drive circuit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
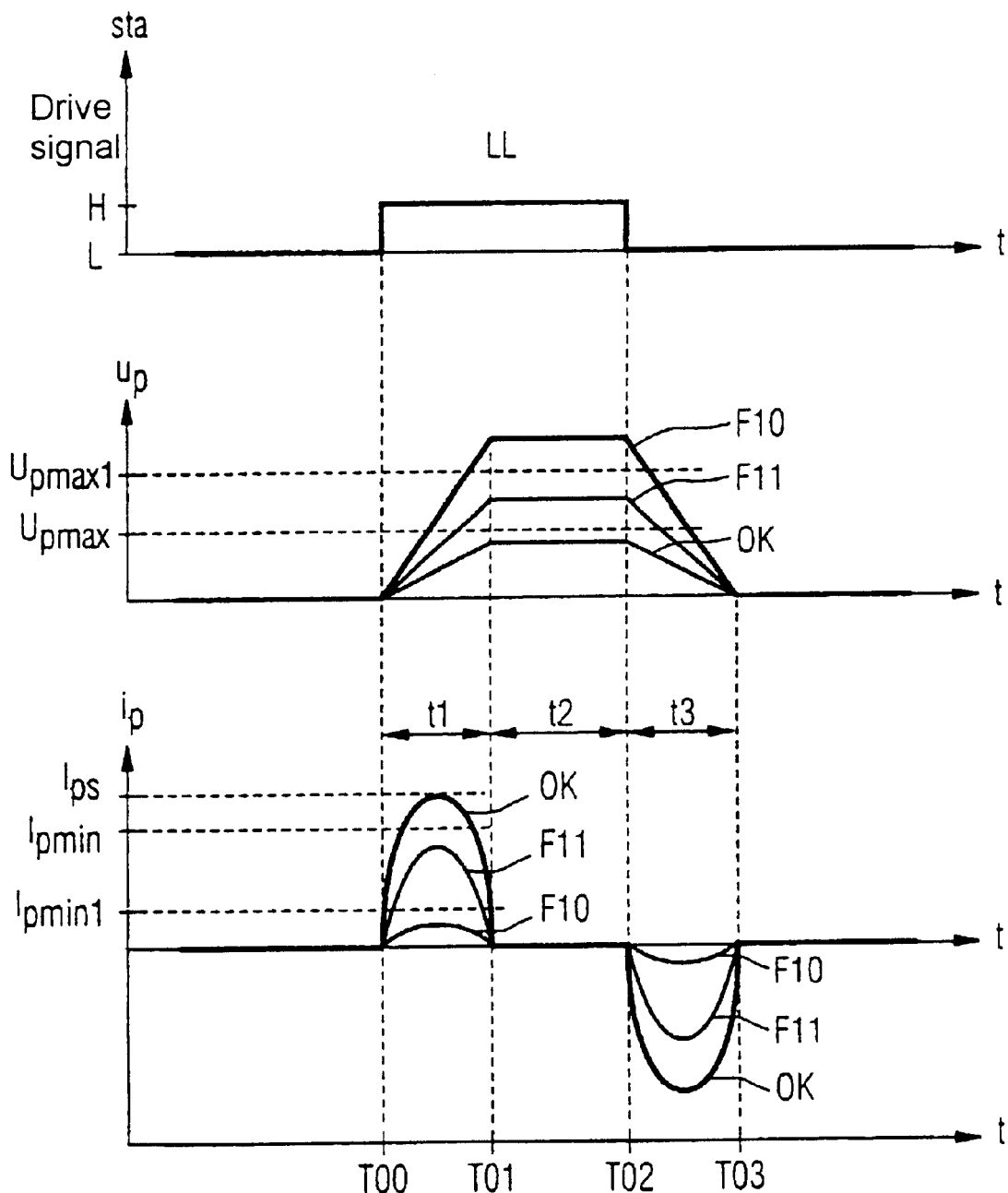
FIG. 1 is a set of timeline graphs indicating the profile of the actuator current and the actuator voltage as a function of functional statuses according to the invention.

In all the figures of the drawing, sub-features and integral parts that correspond to one another bear the same reference symbol in each case.

Figure 6:
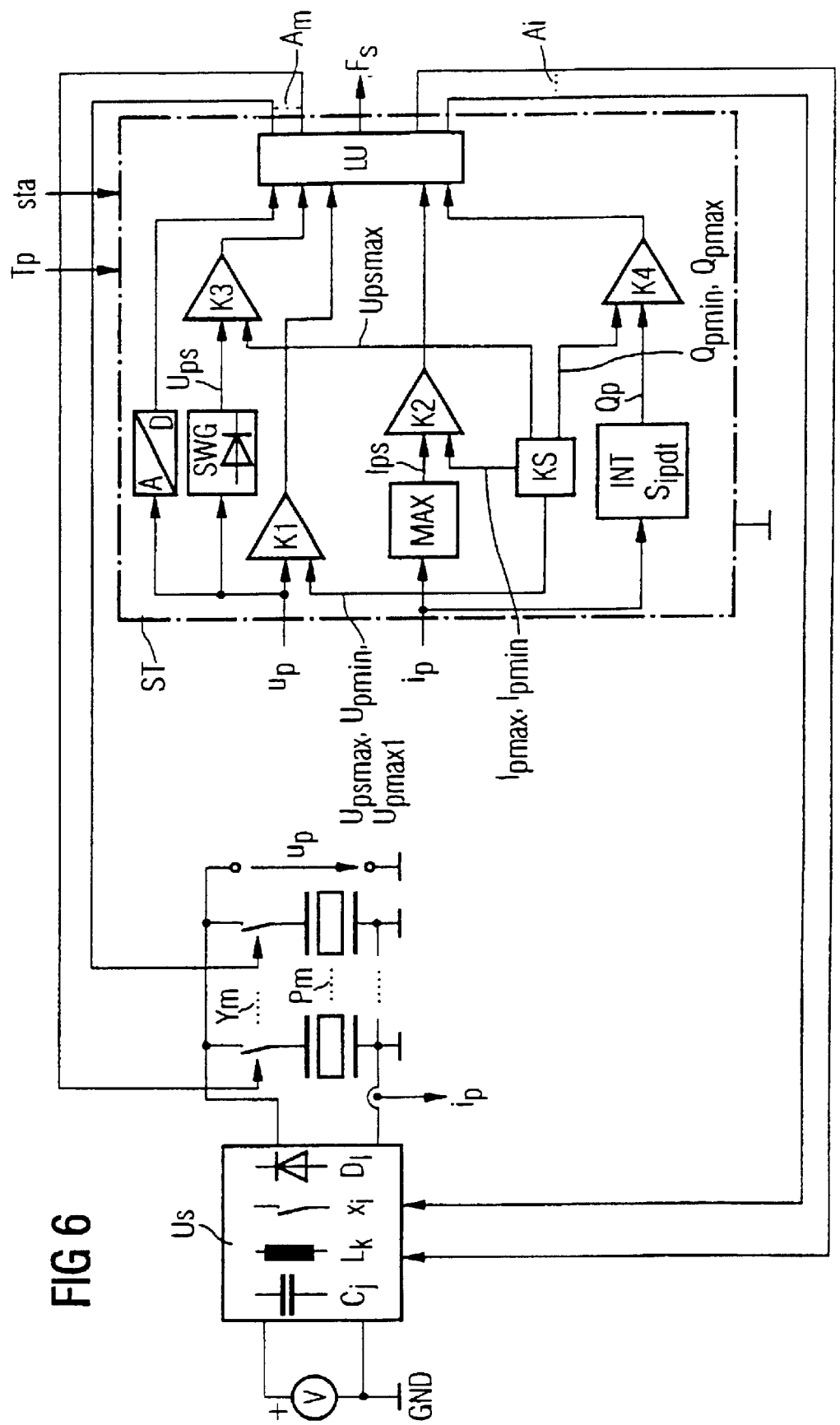
FIG. 6 is a block and schematic circuit diagram of a drive circuit with a charge-reversal circuit, a controller, and actuators for carrying out the method according to the invention.

Referring now to the figures of the drawings in detail and first, particularly to FIG. 6 thereof, there is shown an actuator Pm including a number of piezoelectric disks that are disposed one above the other and form a piezoelectric stack. The piezoelectric disks are electrically connected to one another through contact surfaces that are preferably fitted to the piezoelectric stack at the side. The actuator Pm lengthens when an actuator voltage $u_p$ is applied.

Actuators are used, for example, in fuel injection valves in order, through a valve, to control the injection process into the combustion chamber of an internal combustion engine. To achieve low-emission combustion and high internal combustion engine efficiency, it is important for the injected amount to differ only to a minor extent from a predeterminable nominal injected amount. Such a difference can be done only by serviceable actuators.

To diagnose faults in the actuator Pm or in its supply lines, the measured values of the actuator voltage up and of the actuator current $i_p$ are used to deduce the functional status of the actuator Pm and of the associated drive circuit. The following functional statuses may occur:

The actuator Pm and its supply lines for the actuator Pm have no faults (serviceable functional status OK).

The contact tracks of the actuator P or of its supply lines to the drive circuit are interrupted (interruption F10), so that the actuator Pm does not deflect.

The actuator Pm has an excessively low actuator capacitance (F11).

One or more contact tracks in the actuator Pm are briefly interrupted during the deflection process (short-term interruption F2), with the deflection process taking place during a rise time t1. Consequently, the energy transmission to the actuator Pm is briefly interrupted, as a result of which the deflection of the actuator Pm, and, thus, the start of injection, are delayed, which leads to a change in the injected amount.

The electrical connections within the actuator Pm or between the drive circuit and the actuator Pm are short-circuited (short-circuit F30). A short-circuit F30 can occur in the actuator Pm, in its supply lines or in the output stage of the drive circuit. The actuator Pm is not deflected.

FIG. 1 shows the time profile of a drive signal sta and various voltage and current profiles of the actuator voltage $u_p$, measured across an actuator Pm, and of the actuator current $i_p$ flowing through the actuator Pm, as a function of various functional statuses. At the time T00, a drive signal sta initiates the start of a drive process for an actuator Pm. During the rise time t1, the actuator Pm is charged through a drive circuit, described in FIG. 6, until the time T01. As a result, the actuator is deflected. The actuator voltage up rises approximately with a cosine waveform, and the profile of the actuator current $i_p$ rises in an approximately sinusoidal positive half-cycle. After the charging process ends at the time T01, the actuator voltage up is maintained across the actuator Pm for a hold time t2. As a result, the actuator Pm remains in its deflected position. No actuator current $i_p$ flows. At the time T02, at the end of the hold time t2, the drive signal sta initiates the end of the drive process. During the subsequent decay time t3, the actuator Pm is discharged, with the actuator voltage up falling with an approximately cosine waveform, and the profile of the actuator current $i_p$ being a negative half-sinusoid. At the time T03 at the end of the decay time t3, the actuator Pm is discharged, and has returned to its rest position. At the time T02, the drive signal sta signals the end of the drive process.

To simplify the illustration, the actuator voltage profiles, which rise and fall with a cosine waveform, have been illustrated rising and falling approximately linearly in FIGS. 1 to 4.

During the rise time t1, the actuator current $i_p$ reaches its maximum value at the actuator peak current Ips.

The actuator voltage and actuator current profiles in FIGS. 1 to 5 are typical of charge-reversal processes as a function of different functional statuses, with the actuator Pm shown in a charge-reversal circuit Us from FIG. 6 having an amount of energy or a charge Qp transmitted to it. The actuator Pm is charged from a charge-storage capacitor Cj through a ringing coil Lk. The charge-storage capacitor Cj, the ringing coil Lk, and the actuator Pm form a series tuned circuit Cj-Lk-Pm, resulting in the actuator voltage and current profiles shown in FIGS. 1 to 5 during charge reversal, as a function of various functional statuses.

FIG. 1 shows actuator voltage and actuator current profiles which correspond to the functional statuses OK, F10, and F11, with a serviceable functional status OK being deduced when the actuator voltage up is less than a predetermined upper voltage value Upmax or the actuator current $i_p$ is greater than a predetermined lower current value Ipmin. The actuator voltage $u_p$ is measured during the rise time t1 or, preferably, during the hold time t2. The actuator peak current Ips is formed during the rise time t1 by a maximum value forming device MAX, which evaluates the actuator current $i_p$ during the rise time t1.

If the actuator voltage $u_p$ is greater than the predetermined upper voltage value Upmax, or the actuator peak current Ips is less than the lower current value Ipmin, then an interruption F10 is deduced. If the actuator voltage is greater than a further upper voltage value Upmax1 or the actuator peak current Ips is less than a further lower current value Ipmin1, then an excessively low actuator capacitance F11 is deduced. Due to the series tuned circuit Cjnk and Pm, an excessively low actuator capacitance or an interruption results in an increased voltage across the actuator Pm, which results in a reduced actuator peak current Ips, and which are evaluated by comparison with the predetermined current and voltage values Ipmin, Ipmin1, Upmax, Upmax1.

The actuator current $i_p$ is preferably evaluated to determine an interruption F10 because the difference between the actuator current $i_p$ in a serviceable functional status OK and the actuator current $i_p$ in the presence of an interruption F10 is sufficiently great to make it possible to distinguish reliably between these functional statuses by choice of suitable threshold values, even if the measurement accuracy is poor.

Figure 2:
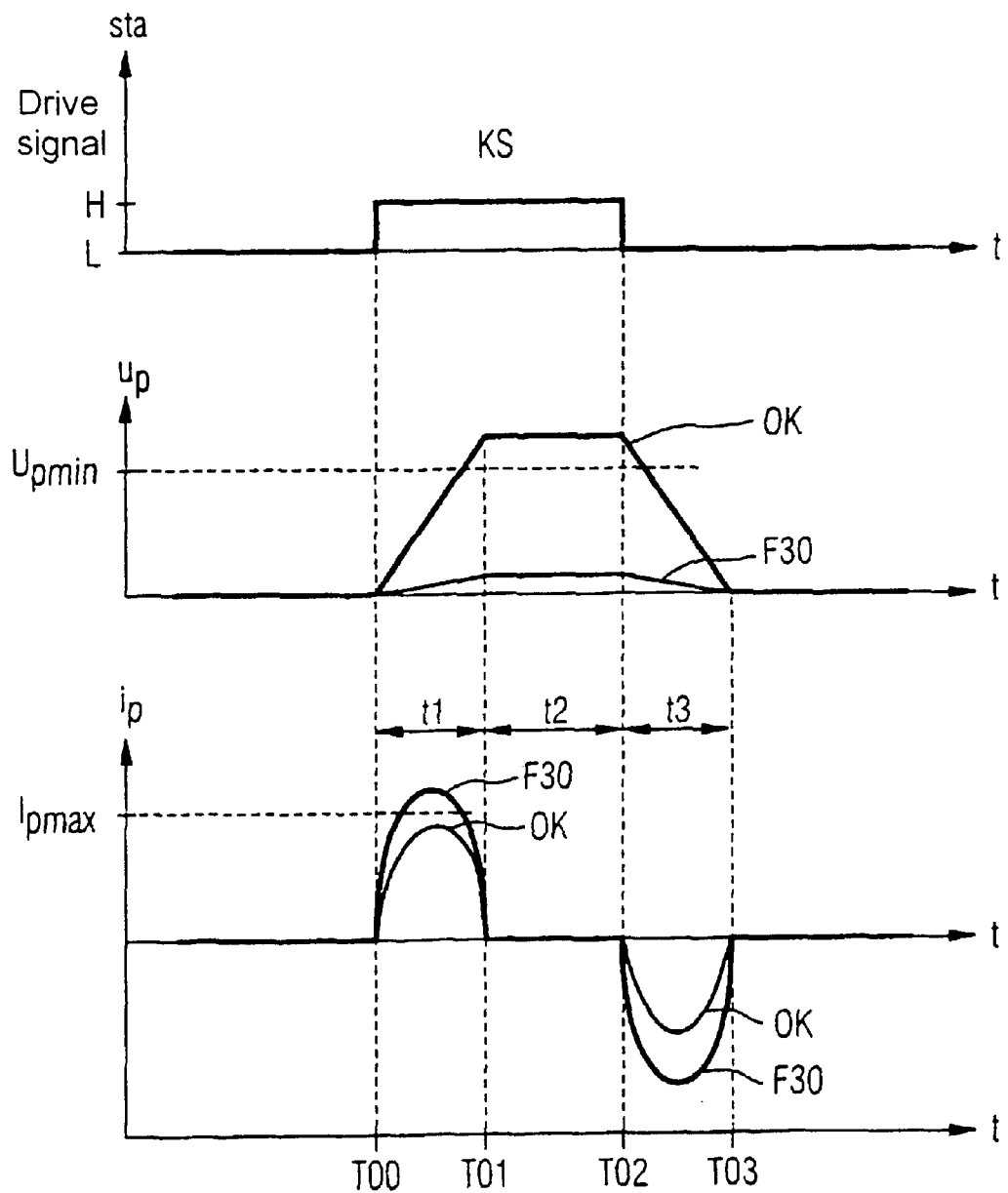
FIG. 2 is a set of timeline graphs indicating the profile of the actuator current and the actuator voltage as a function of further functional statuses according to the invention.

FIG. 2 shows actuator voltage and actuator current profiles that correspond to the serviceable functional statuses OK and the short-circuit F30 in the actuator Pm. The charge-reversal process of the series tuned circuit Cj-Lk-Pm from FIG. 6 results, in the event of a short-circuit F30, in a reduced actuator voltage $u_p$, which is less than a predetermined lower voltage value Upmin, and an actuator peak current Ips that is greater than a predetermined upper current value Ipmax.

Thus, the appropriate fault type is deduced from the comparison of the actuator voltage up or of the actuator peak current Ips with predetermined upper and lower voltage or current peak values Upmin, Upmax, Upmax1, Ipmin, Ipmin1, and Ipmax. To determine the functional status, it is sufficient just to evaluate one of the variables actuator current $i_p$ or actuator voltage $u_p$, although both variables can also be used for evaluation.

The actuator voltage $u_p$ is preferably evaluated to determine the short-circuit F30 because the difference between the actuator voltage $u_p$ with a serviceable functional status OK and the actuator voltage $u_p$ in the presence of a short-circuit F30 is large enough to make it possible to distinguish reliably between these functional statuses by choice of suitable threshold values, even if the measurement accuracy is poor.

The actuator voltage $u_p$ and the actuator current $i_p$ are preferably evaluated to determine a short-circuit F10 or an interruption F10 because the difference between the actuator current $i_p$ with a serviceable functional status OK and the actuator current $i_p$ in the presence of an interruption F10, and the difference between the actuator voltage $u_p$ with a serviceable functional status OK and the actuator voltage $u_p$ in the presence of a short-circuit F30 are large enough to make it possible to distinguish reliably between these functional statuses by choice of suitable threshold values, even if the measurement accuracy is poor.

Figure 3:
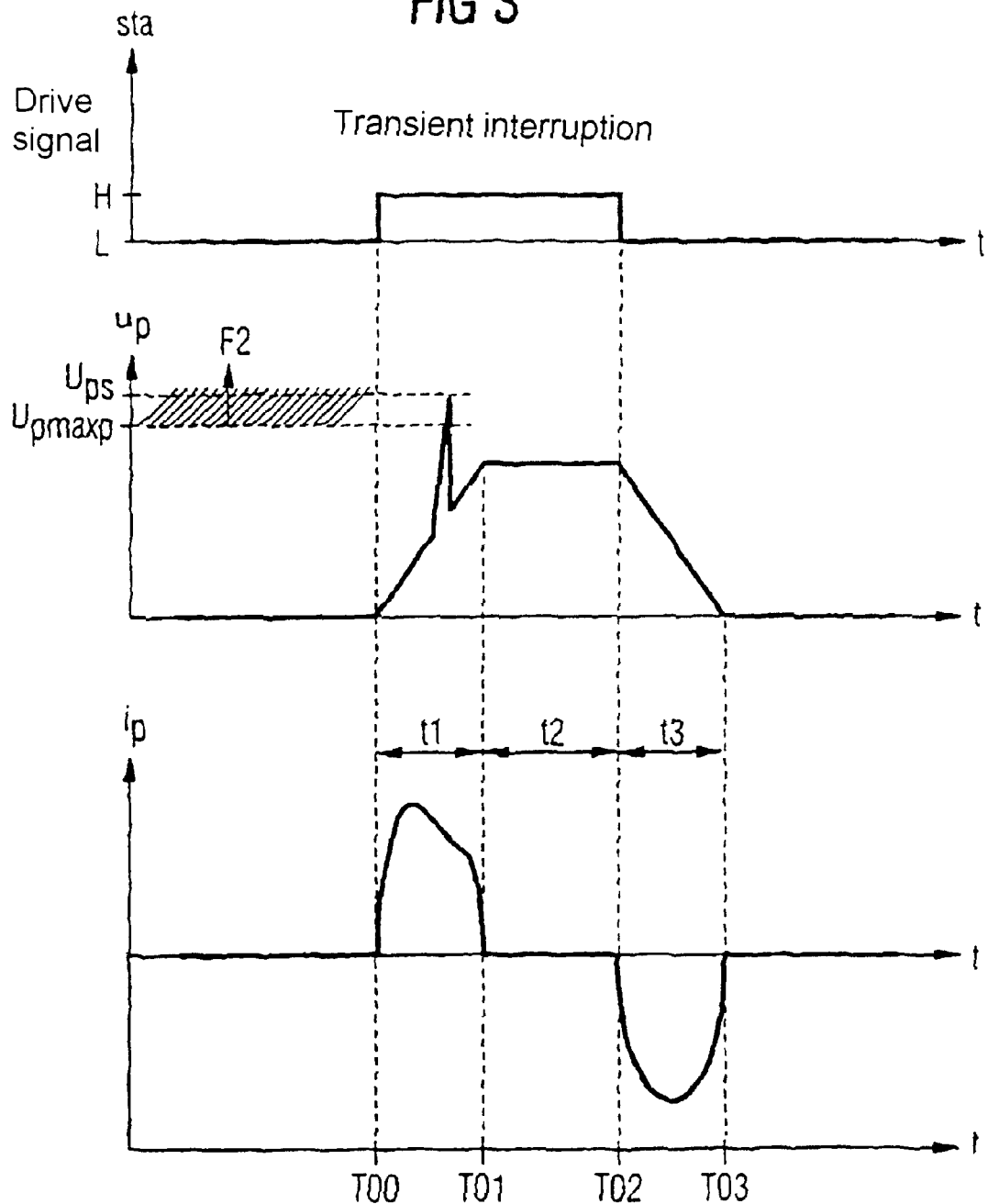
FIG. 3 is a set of timeline graphs indicating the profile of the actuator current and the actuator voltage as a function of further functional statuses according to the invention.

The voltage profile of the actuator voltage $u_p$ in FIG. 3, which is measured during the rise time t1, is used to deduce a short-term interruption F2 in the contact tracks in the actuator Pm, which leads to a delay in the deflection of the actuator Pm and the start of injection being delayed. If the fault occurs, the short-term interruption during the rise time t1 results in a brief rise in the actuator voltage $u_p$ in the form of an actuator peak voltage Ups that is greater than a predetermined upper peak voltage Upsmax. The voltage increase is caused by the inductance of the ringing coil Lk in the charge-reversal circuit Us. The actuator peak voltage Ups is detected in a peak value detector SWG, is compared with a predetermined upper peak voltage Upsmax, and is evaluated. The short-term interruption can occur during the rise time t1 or during the decay time t3. As a result, the actuator is deflected with a delay, or returns to its rest position with a delay, thus delaying the opening and closing of the injection valve.

Figure 4:
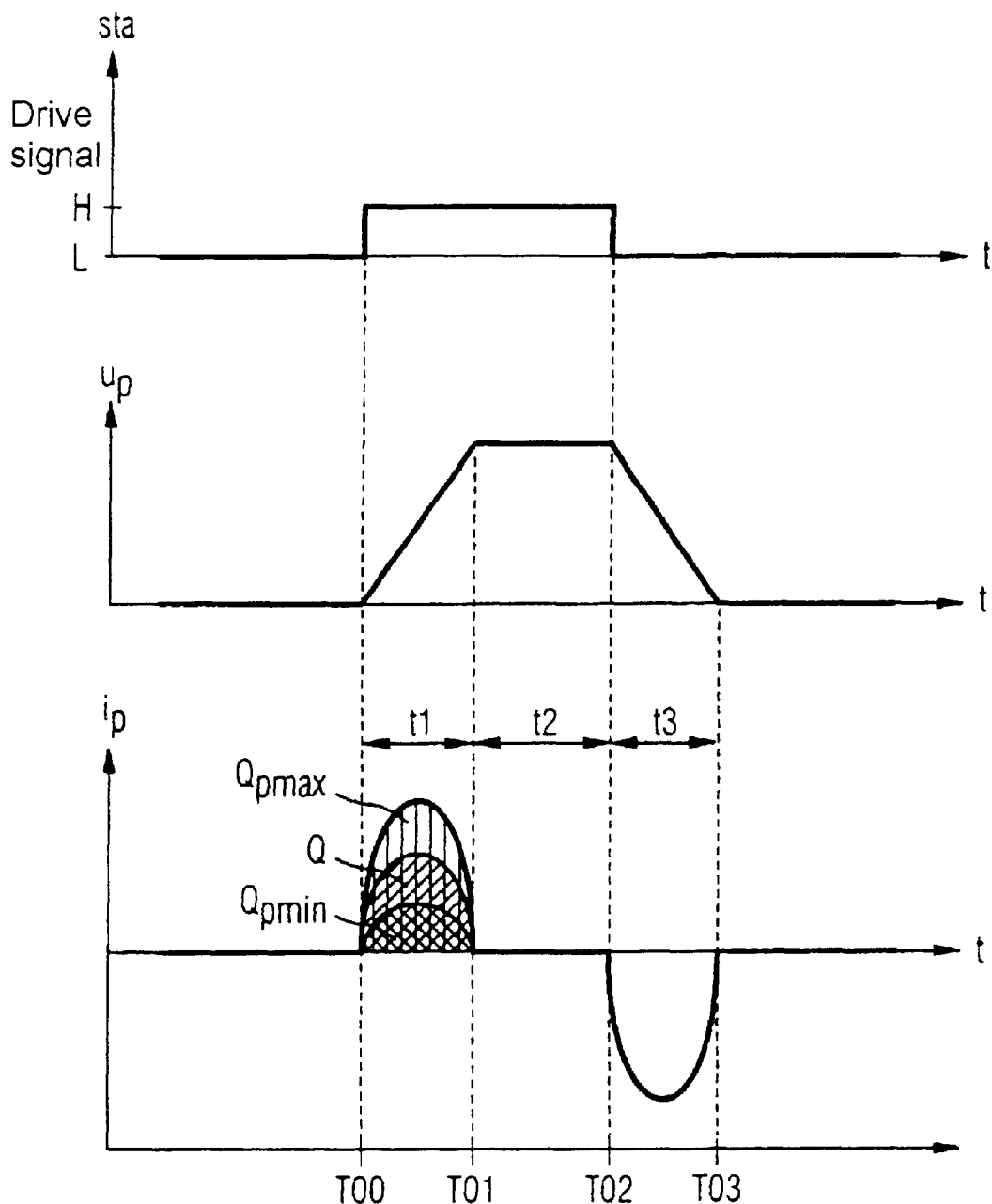
FIG. 4 is a set of timeline graphs indicating the profile of the actuator current with the actuator charge being integrated as a function of further functional statuses according to the invention.

FIG. 4 shows the actuator charge Qp applied to the actuator Pm during the charge-reversal process, which actuator charge Qp corresponds to the integral of the actuator current $i_p$ over the rise time t1, is compared with a lower and upper charge value Qpmin, Qpmax and is evaluated. If it is greater than the upper charge value Qpmax, a short-circuit F3 is indicated, and if it is less than the lower charge value Qpmin, an interruption F10 is indicated. The fault types can be evaluated in greater detail by introducing further predetermined upper and lower charge values, as has been described in the previous figures by equivalence to the actuator current and actuator voltage comparison values.

In a further embodiment, the actuator charge Qp is evaluated to determine an interruption F10 because the difference between the actuator charge Qp with a serviceable functional state OK and the actuator charge Qp in the presence of an interruption F10 is large enough to make it possible to distinguish reliably between these functional statuses by choice of suitable threshold values, even if the measurement accuracy is poor.

The functional status and the fault types can be determined by evaluating one or more of the three variables actuator voltage $u_p$, actuator current $i_p$, and actuator charge Qp.

Actuators have a narrow component tolerance of about 5% of the actuator capacitance. Actuator voltage, actuator current, or actuator charge values $u_p$, $i_p$, Qp of a number of actuators Pm, Pm+1, ... are detected and compared with one another in successive drive processes.

Figure 5:
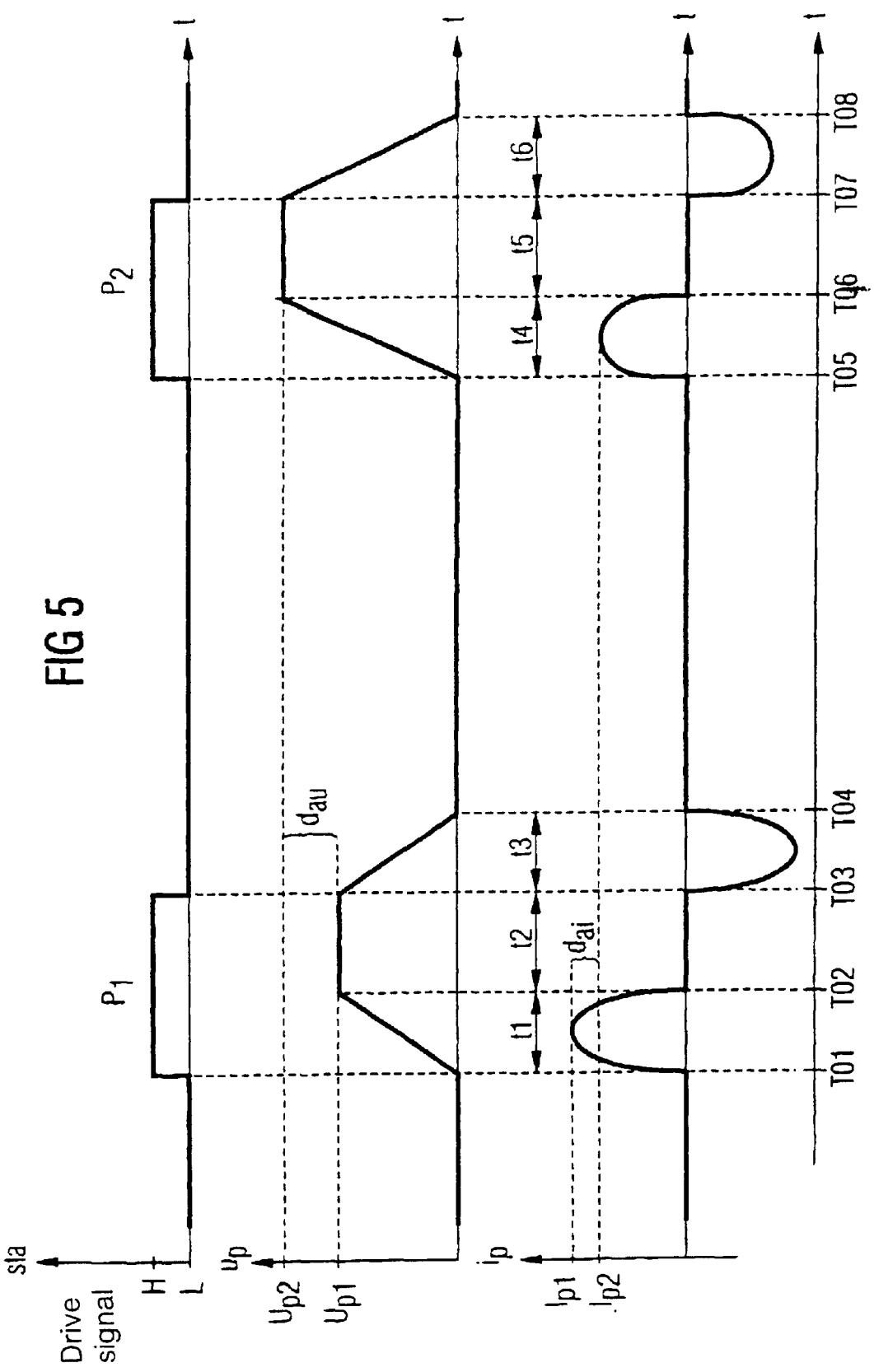
FIG. 5 is a set of timeline graphs indicating the profile of the actuator current and the actuator voltage in two successive drive processes according to the invention.

FIG. 5 shows the actuator voltage and the actuator current profiles $u_p$, $i_p$ of two actuators P1 and P2 in successive drive processes. The evaluation method will be explained, for example, with reference to the evaluation of the measured first and second voltage values Up1, Up2 in two successive drive processes. The voltage discrepancy $d_{au}$ is the voltage difference between the voltage values Up1 and Up2 and is within a predetermined tolerance band when a serviceable functional status OK exists, and is outside the tolerance band when a fault is present. In a corresponding manner to what has been said above, the current discrepancy $d_{ai}$ is formed and is evaluated as the difference between two successively measured current values, the first and the second current value Ip1, Ip2.

Because, in practice, only a small number of actuators within a given number of actuators P1 to Pm will fail at the same time, it is possible to form comparisons of measurements from different actuators following one another successively and to make a majority decision to detect the faulty actuator. In such a case, the type of fault can be established by evaluating the voltage discrepancy $d_{au}$. In a corresponding manner, the actuator peak current Ips or the actuator charge Qp of a number of actuators can be compared with one another, and can be evaluated to determine the functional status.

The actuator capacitance is dependent on the actuator temperature Tp. To compensate for such dependency, the predetermined voltage, current, and charge values Upmax, Upmax1, Upmin, Upmaxp, Ipmin, Ipmin1, Ipmax, Qmin, Qmax are adapted as a function of the actuator temperature Tp. The actuator temperature Tp can be determined, for example, through one or more temperature sensors.

FIG. 6 shows the configuration for carrying out the method for driving and for diagnosis of an actuator Pm, and of an associated drive circuit. The drive circuit for driving an actuator Pm has an energy source V that supplies energy to one or more charge-storage capacitors Cj. The charge-storage capacitor Cj that has been charged to a predetermined charge voltage passes its charge to an actuator Pm through one or more ringing coils Lk. The ringing circuit has diodes D1 and charge-reversal switches Xi that are driven by a controller ST such that the charging process for the charge-storage capacitors Cj takes place from the energy source V, and a predetermined amount of charge energy or a predetermined charge is passed to an actuator Pm. Each actuator Pm has an associated selection switch Ym. The selection switches Ym are controlled by the controller ST through the selection signals Am in accordance with the sequence of the injection processes in the internal combustion engine.

The controller ST may be part of a microprocessor-controlled engine controller, which is not illustrated in any more detail.

The controller ST is controlled by a microprocessor-controlled logic unit LU. The controller ST is supplied with the following input signals:

a drive signal sta that initiates and ends the drive process for an actuator Pm;

the measured actuator voltage $u_p$;

the actuator current $i_p$, which is preferably measured across a measurement resistor in the cable on the negative pole side between the actuator Pm and the reversing circuit Us; and the actuator temperature Tp.

The controller ST has the following output signals:

control signals Ai, which drive the charge-reversal switches Xi in the charge-reversal circuit Us;

selection signals Am that drive the selection switches Ym to select an actuator Pm; and a function signal Fs, which outputs the functional status, preferably to the external engine controller, which initiates a reaction to the fault.

The controller ST has the following components:

a logic unit LU that outputs the output signals Ai, Am, Fs, with the function signal Fs preferably being supplied to the external engine controller for further fault action;

a voltage comparator K1, which compares the actuator voltage $u_p$ with the predetermined upper and lower voltage values Upmin, Upmax, Upmax1, and passes the result of the comparison to the logic unit LU;

a peak value comparator K3, which compares the actuator peak voltage Ups with a predetermined, upper peak voltage Upsmax and passes the result to the logic unit LU, with the actuator peak voltage Ups being determined using a peak value detector SWG from the actuator voltage $u_p$;

an A/D converter, which converts the incoming actuator voltage $u_p$ to digital values and passes them to the logic unit LU. The A/D converter is used to provide the logic unit LU with the actuator voltage $u_p$ during the hold time t2 for further processing. The actuator voltage values $u_p$ so determined make it possible to distinguish and differentiate between the fault types in a refined manner. The use of a D/A converter can advantageously reduce the hardware complexity by saving comparators, in which case the comparison can be carried out digitally as part of the program sequence in the logic unit LU. Furthermore, refined differentiation based on further fault types is advantageously possible by introducing further predetermined threshold values;

a current comparator K2 that compares the incoming actuator peak current Ips with the predetermined lower and upper current values Ipmin, Ipmax, Ipmin1, with the actuator peak current Ips being produced from the actuator current $i_p$ by the maximum-value forming device MAX. The result of the comparison is supplied to the logic unit LU;

a charge comparator K4 that compares the actuator charge Qp supplied to the actuator Pm with a predetermined upper and lower charge value Qpmax, Qpmin, with an integrator INT forming the integral of the actuator current $i_p$ over the time t, preferably, over the rise time t1. The result of the comparison is supplied to the logic unit LU. The circuit path can replace the circuit path with the maximum-value forming device MAX, in which the actuator peak current Ips is determined; and a constant memory KF, which supplies predetermined comparison values to the comparators K1 to K4.

In a further embodiment, an A/D converter provides the logic unit LU with the actuator charge Qp or the actuator peak current Ips in digitized form. The configuration advantageously allows a fine evaluation of the fault types F10, F11, and F30.

The logic unit LU outputs drive signals Am that control the selection switches Ym to select an actuator Pm, and control signals Ai to the charge-reversal circuit Us, by which is controlled the profile of the drive of an actuator Pm through the charge-reversal switches Xi.

The function signal Fs is used to output the functional status to the external engine control unit. A reaction to a fault can optionally be initiated in the external engine control unit or in the logic unit LU of the controller ST. When a fault type occurs, a reaction may, for example, include switching off the actuator Pm that has been identified as being faulty and disconnecting the relevant cylinder, that is to say not outputting any more drive pulses to the relevant faulty actuator Pm. The process advantageously allows restricted operation of the internal combustion engine despite the presence of a defect, for example, to drive the vehicle to the nearest workshop.

A fault-tolerant reaction to sporadically occurring measurement results or measurement results corrupted by interference pulses is feasible by initiating a reaction only when faults of one fault type have occurred more than a predetermined number of times within a predetermined fault time. The initiation advantageously reduces the effect of external interference influences. The number of faults that occur erroneously or briefly can also be stored in the logic unit LU, for example, to be evaluated on the next visit to a workshop.

If the injection times are very short, as can occur, for example, in a fuel injection valve with pilot injection followed by main injection, the hold time t2 may tend to zero. Advantageously, adaptation of the predetermined voltage, current, and charge values Upmax, Upmax1, Upmin, Upmaxp, Ipmin, Ipmin1, Ipmax, Qpmin, Qpmax can compensate for dynamic reactions from the mechanical system on the actuator Pm.

We claim:

1. A method of diagnosing a capacitive actuator and an associated drive circuit, which comprises:

transmitting a predeterminable amount of energy to an actuator from a charge-storage capacitor through a ringing coil;

deducing a functional status of at least one of the actuator and an associated drive circuit from a discrepancy between reference values and at least one determined variable including:
actuator voltage;
actuator current; and
actuator charge;

deducing a short-circuit of at least one of an electrical connection within the actuator and an electrical connection between the drive circuit and the actuator if the actuator voltage is less than a lower voltage value of the reference values; and deducing an interruption in at least one of the electrical connection within the actuator and the electrical connection between the drive circuit and the actuator if an actuator peak current is less than a lower current value of the reference values.

2. The method according to claim 1, which further comprises deducing a serviceable functional status if the actuator voltage is between the lower voltage value and an upper voltage value of the reference values.

3. The method according to claim 1, which further comprises deducing an excessively low actuator capacitance if the actuator voltage is greater than an upper voltage value of the reference values.

4. The method according to claim 1, which further comprises deducing an interruption in at least one of the electrical connection within the actuator and the electrical connection between the drive circuit and the actuator if the actuator voltage is greater than a upper voltage value of the reference values.

5. The method according to claim 1, which further comprises measuring the actuator voltage during a hold time.

6. The method according to claim 1, which further comprises:

measuring the actuator voltage during a rise time; and
deducing a short-term interruption in the electrical connection within the actuator during a deflection process of the actuator if the actuator voltage is greater than an upper peak voltage of the reference values.

7. The method according to claim 1, which further comprises determining the actuator peak current during a rise time as the maximum value of the actuator current.

8. The method according to claim 1, which further comprises is deducing a correct functional status if the actuator peak current is between a further lower current value of the reference values and an upper current value of the reference values.

9. The method according to claim 1, which further comprises deducing an excessively low actuator capacitance if the actuator peak current is less than a further lower current value of the reference values.

10. The method according to claim 1, which further comprises deducing a short-circuit in at least one of the electrical connection within the actuator and the electrical connection between the drive circuit and the actuator if the actuator peak current is greater than an upper current value of the reference values.

11. The method according to claim 1, which further comprises determining the actuator charge from a charge-storage capacitor to the actuator during a rise time.

12. The method according to claim 1, which further comprises deducing a correct functional status if the actuator charge is between a lower charge value of the reference values and an upper charge value of the reference values.

13. The method according to claim 1, which further comprises deducing an excessively low actuator capacitance if the actuator charge is less than a lower charge value of the reference values.

14. The method according to claim 1, which further comprises deducing an interruption in at least one of the electrical connection within the actuator and the electrical connection between the drive circuit and the actuator if the actuator charge is less than a lower charge value of the reference values.

15. The method according to claim 1, which further comprises deducing a short-circuit of at least one of the electrical connection within the actuator and the electrical connection between the drive circuit and the actuator if the actuator charge is greater than an upper charge value of the reference values.

16. The method according to claim 1, wherein the reference values are dependent on a temperature of the actuator.

17. The method according to claim 1, which further comprises initiating a reaction to a fault after an occurrence of more than a predetermined number of faults of a given fault type within a predetermined fault time.

18. The method according to claim 1, which further comprises:
    determining a discrepancy between a value of the at least one determined variable of the actuator in a drive process from another value of the at least one determined variable of the actuator in a subsequent drive process; and
    deducing a fault if the discrepancy exceeds a predetermined tolerance band.

19. A configuration for diagnosing a capacitive actuator and a drive circuit, comprising:
    a drive circuit having:
        a drive signal for controlling a drive process of said actuators;
        a charge-reversal circuit having:
            at least one charge-storage capacitor;
            at least one ringing coil;
            charge-reversal switches;
            diodes; and
            selection switches; and
        an energy source connected to said charge-reversal circuit;
    actuators having electrical connections, said actuators connected to said charge-reversal circuit, said actuators having actuator voltages, actuator currents, and actuator temperatures;
    said at least one charge-storage capacitor transmitting a predeterminable amount of energy to at least one of said actuators through said at least one ringing coil;
    a microprocessor-controlled controller connected to said drive circuit and to said actuators;
    said controller programmed to process said drive signal, said actuator voltages, said actuator currents, and said actuator temperatures;
    said controller having:
        a constant memory storing reference values including a lower voltage value and a lower current value;
        a logic unit producing control signals driving said charge-reversal switches and selection signals driving said selection switches for selection of said actuators; and
        comparators comparing at least one of said actuator voltages and said actuator currents with said reference values and producing comparison signals for said logic unit;
    said controller outputting a function signal representing a functional status based upon said comparison signals; and said controller programmed to deduce:
        a short-circuit of at least one of an electrical connection within one of said actuators and an electrical connection between said drive circuit and at least one of said actuators if one of said actuator voltages is less than said lower voltage value; and
        an interruption in at least one of an electrical connection within one of said actuators and an electrical connection between said drive circuit and at least one of said actuators if an actuator peak current is less than said lower current value.

20. The configuration according to claim 19, wherein said controller has an analog/digital converter for receiving said actuator voltages and for outputting digitized values of said actuator voltages to said logic unit.

21. The configuration according to claim 19, including a peak value detector to determine a peak voltage of at least one of said actuators based upon at least one of said actuator voltages;
    said reference values including a predetermined upper peak voltage; and
    said controller having a peak value comparator comparing said peak voltage with said predetermined upper peak voltage and outputting a comparison result to said logic unit.

22. The configuration according to claim 19, wherein:
    said reference values include lower voltage values and upper voltage values, and
    said controller has a voltage comparator comparing at least one of said actuator voltages with at least one of said lower voltage values and said upper voltage values and outputting a comparison result to said logic unit.

23. The configuration according to claim 19, including a maximum-value forming device determining said actuator peak current from said actuator currents;
    said reference values including lower voltage values, upper voltage values, and an upper current value;
    said controller having a current comparator comparing said actuator peak current with said lower current value and said upper current value; and
    said controller programmed to output a comparison result to said logic unit.

24. The configuration according to claim 19, including an integrator integrating at least one of said actuator currents over time to determine an actuator charge;
    said reference values including a lower charge value and an upper charge value;

said controller having a charge comparator comparing said charge transmitted to at least one of said actuators with at least one of said lower charge value and said upper charge value; and said controller programmed to output a comparison result to said logic unit.

25. A configuration for diagnosing a capacitive actuator and a drive circuit, comprising:

a drive circuit;

actuators having actuator variables, said actuators connected to said drive circuit;

a controller connected to said drive circuit and to said actuators, said controller having:
    a memory storing reference values including a lower voltage value and a lower current value; and
    comparators comparing at least one of said actuator variables with at least one of said reference values and producing comparison signals;

said controller programmed to output a functional status based upon said comparison signals and to deduce:
    a short-circuit of at least one of said actuators and a connection between said drive circuit and at least one of said actuators if one of said actuator voltages is less than said lower voltage value; and
    an interruption in at least one of said actuators and a connection between said drive circuit and at least one of said actuators if an actuator peak current is less than said lower current value.

* * * * *